United States Patent [19]

Nidiffer

[11] 4,197,586
[45] Apr. 8, 1980

[54] ELECTRONIC CALCULATOR ASSEMBLY

[75] Inventor: Charles A. Nidiffer, Corvallis, Oreg.

[73] Assignee: Hewlett-Packard Company, Palo Alto, Calif.

[21] Appl. No.: 899,622

[22] Filed: Apr. 24, 1978

[51] Int. Cl.² .......................... H05K 5/00; G06M 1/02
[52] U.S. Cl. .................................. 364/708; 361/414; 364/712; 361/398
[58] Field of Search .................. 361/398, 411, 414; 339/17 F, 18 C, DIG. 3; 364/708, 712

[56] References Cited

U.S. PATENT DOCUMENTS

| | | | |
|---|---|---|---|
| 2,881,364 | 4/1959 | Demer et al. | 361/398 |
| 3,002,169 | 9/1961 | Kamm | 339/18 C |
| 3,818,279 | 6/1974 | Seeger, Sr. et al. | 361/398 |
| 3,885,173 | 5/1975 | Lee | 361/411 |
| 3,911,234 | 10/1975 | Kotaka | 361/398 |
| 3,967,162 | 6/1976 | Cresa et al. | 361/398 |
| 4,118,102 | 10/1978 | Kuist et al. | 339/17 F |

Primary Examiner—David Smith, Jr.
Attorney, Agent, or Firm—Patrick J. Barrett

[57] ABSTRACT

An electronic calculator assembly is disclosed having a flexible printed circuit board bonded to a layer of resilient material mounted on a rigid backing plate. An integrated circuit package containing electronic calculator circuitry is held tightly against the flexible printed circuit board by a cradle assembly. Leads from the integrated circuit package make contact areas on the flexible printed circuit board and depress the flexible printed circuit board into the resilient layer. A keyboard assembly is mounted to the opposite side of the rigid member and the flexible printed circuit board is folded around the rigid member so that contact areas on the flexible printed circuit board also form fixed switch contacts for the keyboard.

4 Claims, 7 Drawing Figures

ELECTRONIC CALCULATOR ASSEMBLY

BACKGROUND OF THE INVENTION

This invention relates to electronic calculators and more specifically to the mechanical assembly of the components comprising an electronic calculator.

In prior art, hand-held electronic calculators, the electronic circuitry usually comprises one or more integrated circuits mounted in a plastic or ceramic package with a large number of leads protruding from the sides of the package. Typically, these leads are bent 90° to allow the leads to be inserted in holes in a printed circuit board for soldering in order to make electrical and mechanical connection between the printed circuit board and the integrated circuit.

This commonly used method of assembly has a significant number of drawbacks. When the integrated circuit leads are soldered to the printed circuit board, the integrated circuit is subjected to heat which may damage it and thus reduce the production yield of calculators. Also, in order to insure a good solder joint a flux is usually used to clean the parts and enable the solder to make a good bond between the conductors on the printed circuit board and the integrated circuit package leads. These fluxes are often corrosive and thus must be removed completely after the soldering operation so that gradual deterioration of the contacts will not be caused by any remaining flux. This extra operation, of course, means added cost in the production of the calculator. Occasionally a solder joint will be incomplete so that one lead does not make proper contact with the printed circuit board. On the other hand, solder may flow up through a hole in the printed circuit board, a process known as wicking, and actually short together two leads. Inspection after the soldering operation is typically necessary and some touch up of the assembly is also necessary in order to make sure that all solder joints are good and that there are no shorts. These hand operations naturally add to the cost of assembling a calculator. If upon inspection it is found that an integrated circuit is defective, the entire assembly must either be discarded or the integrated circuit must be removed, typically by manually unsoldering all of the joints, and a new integrated circuit must then be soldered in by hand in its place. This operation makes reworking expensive.

One of the prior methods for solving some of these problems is to provide a socket for the integrated circuit. The socket is soldered into the printed circuit board and the leads of the integrated circuit package are inserted into the socket. These sockets, however, are relatively expensive and still do not prevent the problems of flux corrosion and wicking. In addition, such sockets add bulk and weight to the assembly and space is usually at a premium in hand-held electronic calculators.

SUMMARY OF THE INVENTION

In accordance with the preferred embodiment of the present invention, a hand-held electronic calculator is assembled around a flat rigid member which acts as a central core for the calculator assembly. This rigid member is preferably a steel plate on one side of which a resilient material such as a sponge rubber is bonded. A flexible printed circuit board wraps around the plate and is bonded to the plate on one side and to the resilient material on the other side. The flexible printed circuit board has contact areas for engaging the leads from integrated circuit packages as well as contact areas for forming fixed switch contacts for keyboard switches. The contact areas for the integrated circuit package leads are on the side of the plate having the resilient layer under the flexible printed circuit board. The integrated circuit packages are held against the flexible printed circuit board by a cradle assembly so that the leads from the integrated circuit packages are pressed against the contact areas and deflect the flexible printed circuit board into the resilient layer. The resilient layer, in response, applies pressure to the flexible printed circuit board to keep the contact areas and the integrated circuit package leads in intimate mechanical contact, thereby making a good electrical contact.

The present invention overcomes a number of the problems found in prior art electronic calculator assemblies. Since the integrated circuit leads are not soldered to a printed circuit board, they are not exposed to dangerous heat levels which might damage the internal circuitry nor are corrosive fluxes nucessary. Hand inspection and reworking of the solder joints is not necessary since there are no solder joints, and the calculator can be functionally tested without assembling the entire calculator. If an integrated circuit is found to be defective, it can be easily removed and a new integrated circuit can be inserted into the assembly without the time-consuming operation of unsoldering an integrated circuit.

DESCRIPTION OF THE PREFERRED EMBODIMENT

Figure 1:
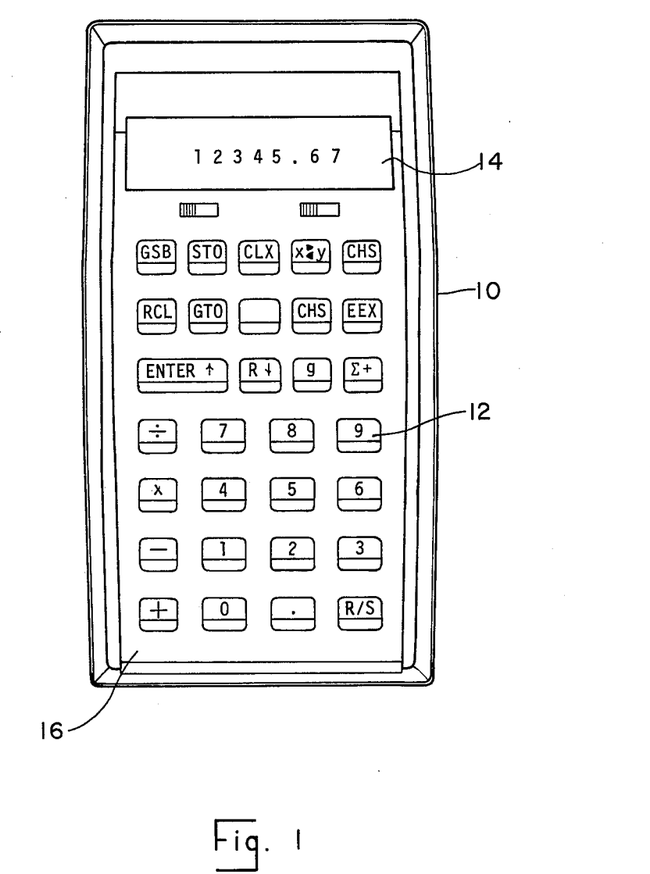
FIG. 1 shows an electronic calculator constructed in accordance with the preferred embodiment of the present invention.
Figure 2:
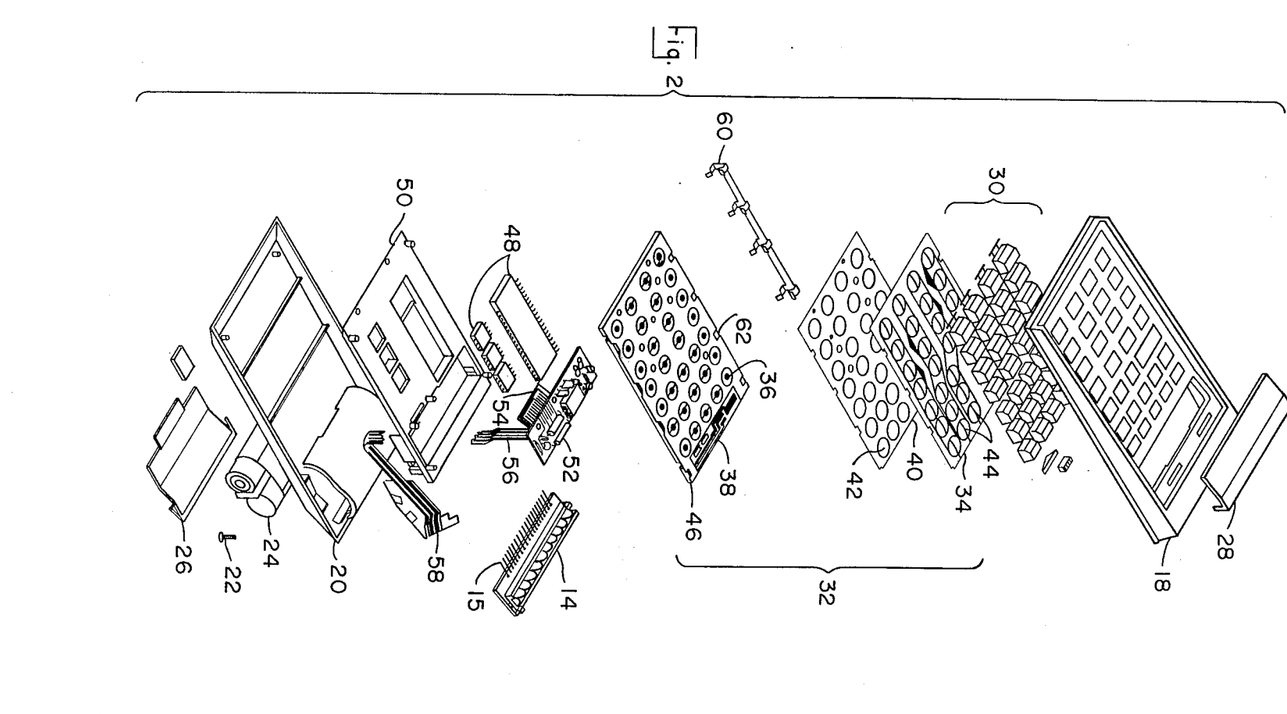
FIG. 2 shows an exploded view of the calculator of FIG. 1.

FIG. 1 shows hand-held electronic calculator 10 having a keyboard 12 and a display 14. An outer case 16 encloses the internal calculator assembly as shown in FIG. 2.

Outer case 16 comprises top case 18 and bottom case 20 which are fastened together by screws such as screw 22. Bottom case 20 houses batteries 24 which are covered by a battery door 26. Top case 18 has a display window 28 mounted in it through which display 14 may be seen. A plurality of keys 30 are also mounted in the top case for actuating key switches in a keyboard assembly 32 located below the keys.

The keyboard assembly may be one such as is disclosed in U.S. Pat. No. 3,643,041 and may comprise a key actuator sheet 34 having a plurality of dimples 44 formed therein with conductive areas on the lower surface of the key actuator sheet. These conductive areas (not shown) form moving switch contacts which are in registry with fixed contacts such as contact 36 on flexible printed circuit board 38. Key actuator sheet 34 is separated from flexible printed circuit board 38 by a separator sheet 40 which has a plurality of holes such as hole 42 which permit contact between conductive areas on key actuator sheet 34 and contacts 36 when a dimple 44 is depressed by a key 30. Flexible printed circuit board 38 forms a part of a circuit assembly 46 which will be described in greater detail below.

A plurality of packaged integrated circuits 48 is held in a cradle 50 against circuit assembly 46. Likewise, the leads 15 from display 14 are also held against circuit assembly 46 by cradle 50. In addition, power supply 52 is also held in cradle 50 and has a contact area 54 for connection with circuit assembly 46. Power supply 52 is connected to batteries 24 via a flexible printed circuit cable 56 and battery contact assembly 58.

Cradle 50 is held securely against circuit assembly 46 by clips such as clip 60 which fit over the edges of circuit assembly 46 and cradle 50 engaging holes such as hole 62. The assembly formed thereby in turn fits into appropriate recesses in bottom case 20 and top case 18.

Figure 3:
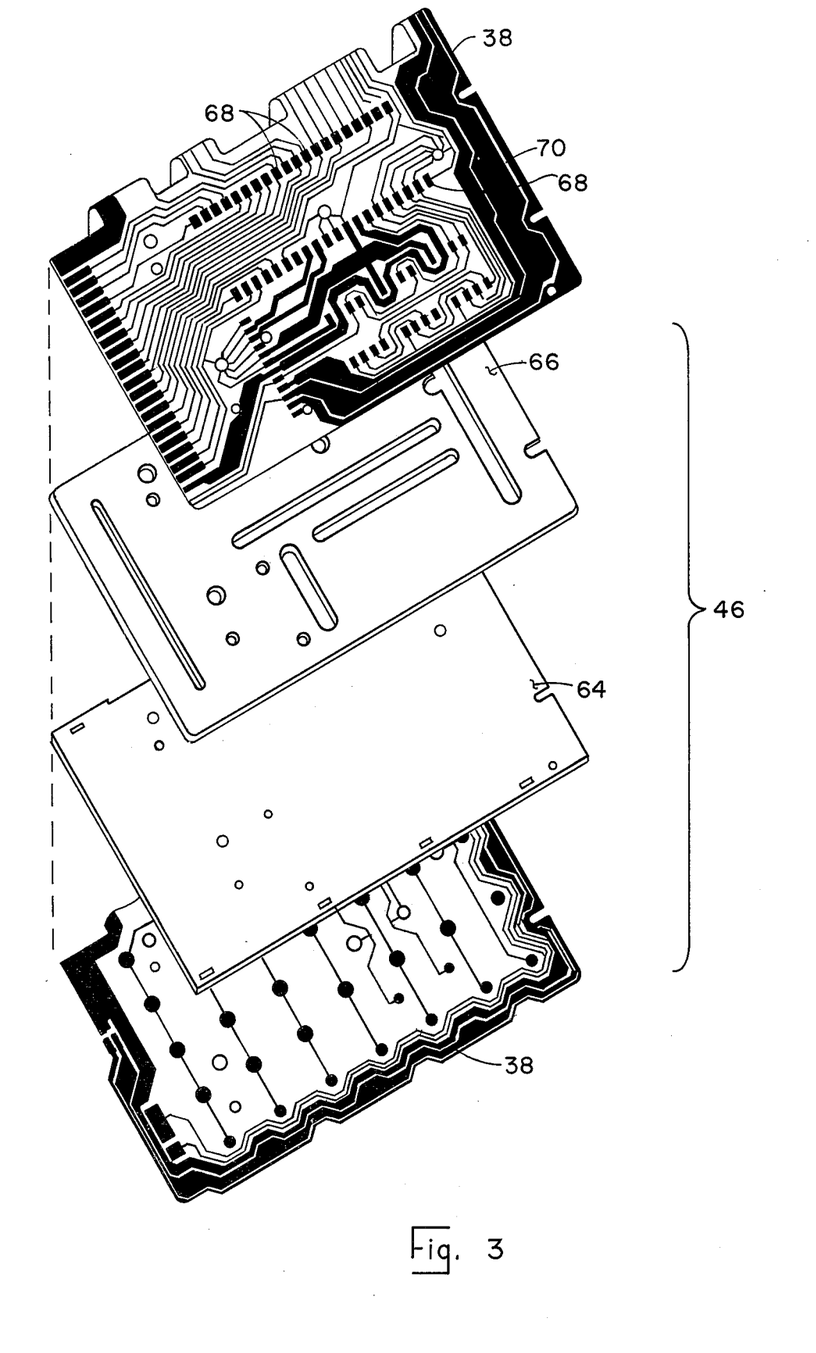
FIG. 3 shows an exploded view of a printed circuit assembly with a resilient layer and a backing plate.

FIG. 3 shows an exploded view of circuit assembly 46 which comprises flexible printed board 38, resilient layer 64, and rigid backing plate 66. Rigid backing plate 66 may be a steel plate, for example, approximately 0.048 inches thick and resilient layer 64 may be a sponge rubber or similar material such as Poron, a commercially available polyurethane foam approximately 0.060 inches thick. Resilient layer 64 is bonded to rigid backing plate 66 and flexible printed circuit board 38 is in turn bonded on one side to resilient layer 64 and on the other side directly to rigid backing plate 66. A portion of flexible printed circuit board 38 wraps around the edge of this sandwich structure to facilitate making connection between circuitry on both sides of the rigid backing plate.

Flexible printed circuit board 38 has a plurality of conductive contact areas on the surface above the resilient layer 64, denominated circuit surface 70 here. Conductive contact area 68 on circuit surface 70 are for engaging leads from packaged integrated circuits 48.

Figure 4:
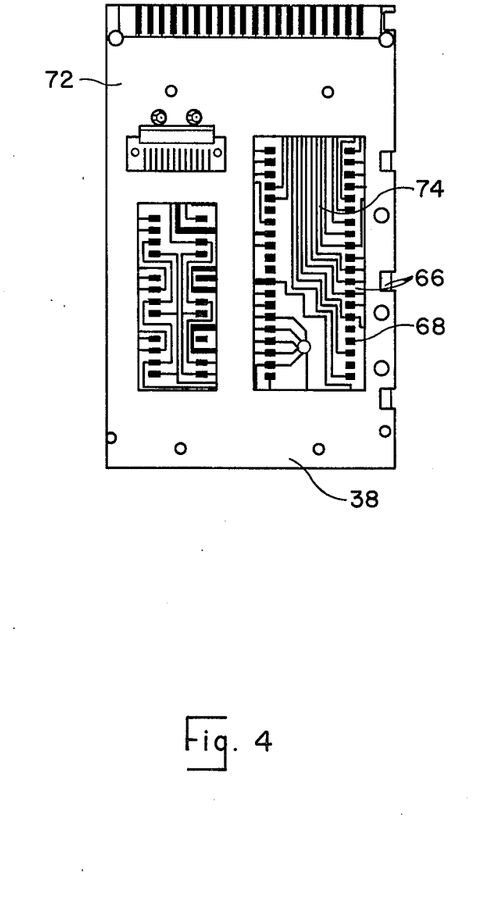
FIG. 4 shows a top view of the assembly of FIG. 3.

As can be seen from FIG. 4, flexible printed circuit board 38 may be covered in part with an insulating layer 72 to protect the conductors on flexible printed circuit board 38 from dirt, contamination, corrosion, etc. except those conductive contact areas 68 which must be exposed for engaging leads from packaged integrated circuits 48. It can also be seen from this figure that areas of resilient layer 64, such as area 74, may be recessed or cut out except in those regions immediately beneath conductive contact areas 68. These cut out areas help provide more pressure against the contacts to make a more reliable connection with leads from packaged integrated circuits 48.

Figure 5:
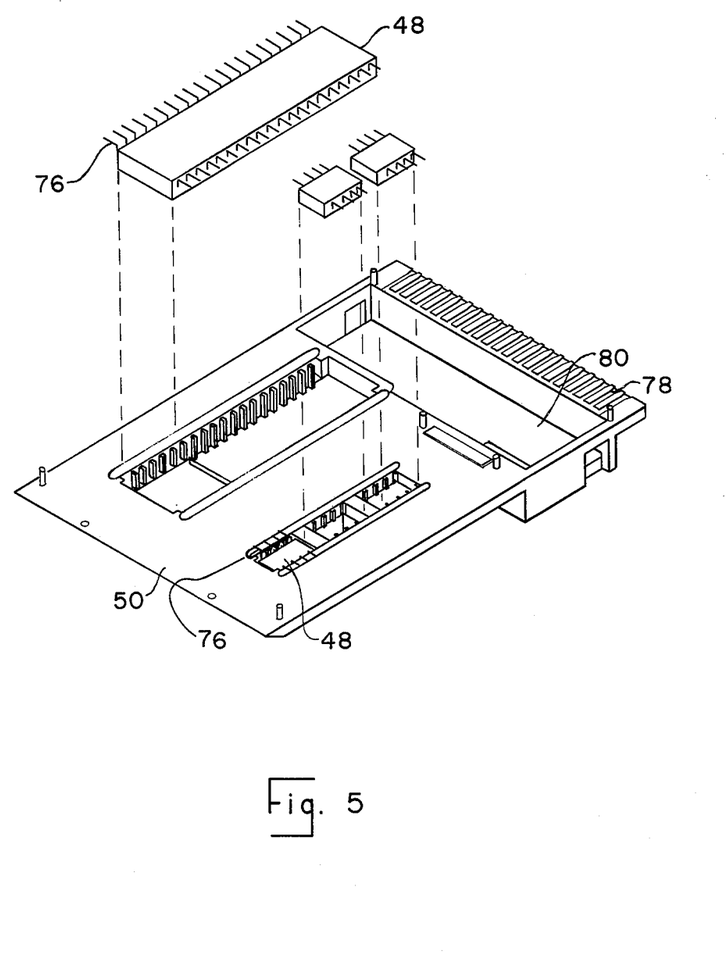
FIG. 5 shows a cradle for holding packaged integrated circuits.

FIG. 5 shows cradle 50 holding packaged integrated circuits 48 with integrated circuit leads 76 exposed on one surface of cradle 50. Cradle 50 also has grooves 78 for leads from display 14 and a recess 80 for receiving power supply 52.

Figure 6:
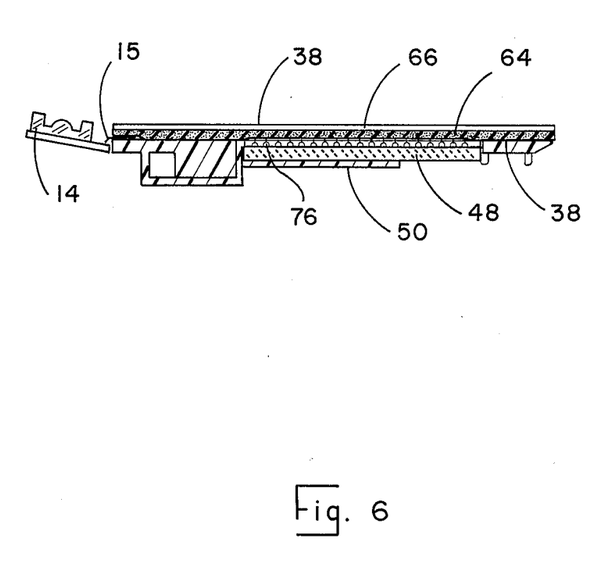
FIG. 6 shows a cross-sectional view of a packaged integrated circuit held against a circuit assembly with a cradle.

FIG. 6 shows a cross-sectional view of circuit assembly 46 attached to cradle 50 with integrated circuit 48 held against flexible printed circuit board 38 by the cradle. As can be seen from the figure, leads 76 from the integrated circuit deflect flexible printed circuit board 38 and deform resilient layer 64 which causes resilient layer 64 to press contact areas 68 against leads 76, thereby insuring a good electrical contact. Likewise, leads 15 from display 14 are pressed against contact areas on flexible printed circuit board 38 by cradle 50 to deform resilient layer 64 and thereby make a good electrical contact between leads 15 and corresponding contact areas on flexible printed circuit board 38.

Figure 7:
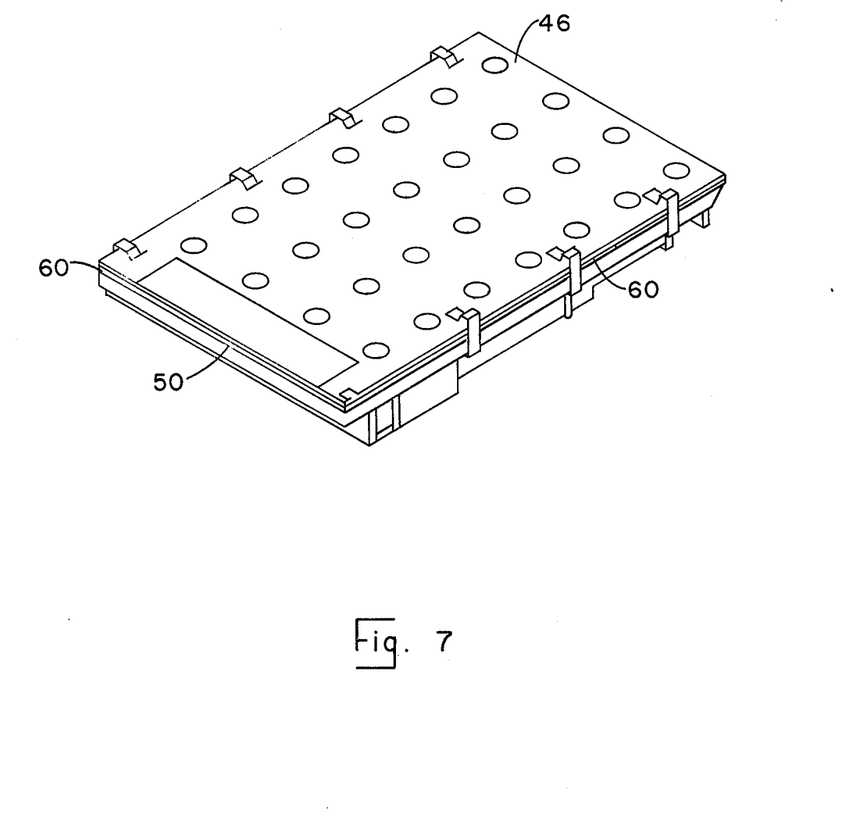
FIG. 7 is a perspective view of the assembly of FIG. 6.

FIG. 7 shows how clips 60 extend around the edges of circuit assembly 46 and cradle 50 to clamp the two together thereby forcing cradle 50 against circuit surface 70 and holding integrated circuit leads 76 in intimate contact with contact areas 68.

I claim:

1. An electronic calculator assembly comprising:
   an integrated electronic circuit having a first set of generally coplanar conductive leads;
   a visual display having a second set of generally coplanar conductive leads;
   a rigid support member having first and second plane surfaces;
   a layer of resilient material attached to the first plane surface of the rigid support member;
   a flexible printed circuit board having a first and a second portion, having on a first surface of the first and second portions a plurality of conductive paths and further having on the first surface of the first portion a plurality of conductive contact areas for engaging the first and second sets of conductive leads, the first portion of the flexible printed circuit board being situated on and attached to the layer of resilient material, the second portion of the flexible printed circuit board being situated on and attached to the second plane surface of the rigid support member, and a third portion of the flexible printed circuit board connecting the first and second portions and extending over an edge of the rigid support member;
   a cradle having a first recess for receiving the integrated electronic circuit and the first set of conductive leads and a second recess for receiving the second set of conductive leads, the cradle holding the first and second sets of conductive leads in alignment and contact with the corresponding contact areas on the flexible printed circuit board to deflect the contact areas into the resilient layer to ensure electrical contact between the conductive leads and the contact areas;
   a keyboard assembly connected to conductive paths on the second portion of the flexible printed circuit board; and
   a case enclosing the support member, the layer of resilient material, the flexible printed circuit board and the cradle.

2. An electronic calculator assembly as in claim 1 further comprising a "U" shaped spring clip for holding the cradle to the rigid support member.

3. An electronic calculator assembly as in claim 2 wherein portions of the resilient layer are recessed.

4. An electronic calculator assembly as in claim 2 further comprising switch contact areas for the keyboard assembly on the second portion of the flexible printed circuit board.

* * * * *

UNITED STATES PATENT AND TRADEMARK OFFICE
CERTIFICATE OF CORRECTION

PATENT NO. : 4,197,586

DATED : April 8, 1980

INVENTOR(S) : Charles A. Nidiffer

It is certified that error appears in the above–identified patent and that said Letters Patent are hereby corrected as shown below:

On the Cover Sheet, Line 7 of the Abstract, after "contact" insert -- with contact --;

Column 2, line 21 "nucessary", should read --necessary--.

Signed and Sealed this

Third Day of February 1981

[SEAL]

Attest:

Attesting Officer

RENE D. TEGTMEYER

Acting Commissioner of Patents and Trademarks